United States Patent [19]

Nelson

[11] 4,386,294
[45] May 31, 1983

[54] TARGET FOR A PYROELECTRIC CAMERA

[75] Inventor: Peter D. Nelson, Chelmsford, England

[73] Assignee: English Electric Valve Company Limited, Chelmsford, England

[21] Appl. No.: 318,942

[22] Filed: Nov. 6, 1981

Related U.S. Application Data

[63] Continuation of Ser. No. 67,744, Aug. 20, 1979, abandoned.

[30] Foreign Application Priority Data

Aug. 22, 1978 [GB] United Kingdom ............... 34087/78

[51] Int. Cl.³ ...................... H01J 29/45; H01J 31/49
[52] U.S. Cl. .................................. 313/388; 313/523; 250/333
[58] Field of Search ..................... 313/388, 101, 14; 250/333, 338

[56] References Cited

U.S. PATENT DOCUMENTS

| | | | |
|---|---|---|---|
| 3,930,157 | 12/1975 | Watton | 313/388 X |
| 4,053,806 | 10/1977 | Turnbull et al. | 313/388 |
| 4,139,444 | 2/1979 | Singer et al. | 313/388 X |
| 4,180,759 | 12/1979 | Harris et al. | 313/388 |

FOREIGN PATENT DOCUMENTS 1395741  5/1975  United Kingdom ............... 313/388

Primary Examiner—Palmer C. Demeo
Attorney, Agent, or Firm—Diller, Ramik & Wight

[57] ABSTRACT

The invention relates to a technique for providing a so-called 'pedestal' voltage on the rear surface of the target of a pyroelectric camera. This is a positive voltage required to ensure efficient discharge, by the electron beam, of the pyroelectric charge. In the invention, the pyroelectric material is in the form of a plurality of islands of pyroelectric material connected individually to the signal plate. Each island is coated on its rear surface and on at least one side, by a conductive film. By applying a positive bias voltage to the signal plate, the rear surface of the pyroelectric islands are similarly biassed to provide the pedestal.

19 Claims, 3 Drawing Figures

TARGET FOR A PYROELECTRIC CAMERA

This application is a continuation of application Ser. No. 67,744, filed Aug. 20, 1979, now abandoned.

BACKGROUND OF THE INVENTION

This invention relates to a pyroelectric camera tube.

A conventional pyroelectric camera comprises a sealed tube containing a target sheet of pyroelectric material. The sheet of pyroelectric material has a front surface which faces the scene to be viewed and which carries a front electrode known as the "signal plate". A rise in temperature of any particular part of the sheet results in a potential difference between opposite faces thereof. This is detected by scanning the rear face of the sheet with an electron beam and observing the resulting charge or discharge current to or from the front electrode.

Problems can arise because of thermal conduction from one particular spot on the pyroelectric sheet to the surrounding area. This reduces the resolution of the camera. A known method of reducing the severity of this problem is to etch a number of closely spaced crossed grooves into the pyroelectric material. The grooves present a barrier to heat conduction, thereby minimising loss of resolution. The technique of using these grooves is known as reticulation.

The grooves are etched by applying a first etch stop in the form of a pattern to the rear surface of the pyroelectric sheets, and then using an etching technique to etch grooves defined by the pattern. If it is desired to etch completely through the sheet it is useful to provide another etch stop in the form of a layer between the signal plate and the pyroelectric sheet to prevent the etching process penetrating the signal plate.

In order to ensure that the scanning electron beam provides an efficient read-out of the charge distribution on the pyroelectric material it is necessary to provide a positive bias on the rear surface. This bias is called the 'pedestal' and can be produced in a number of different ways. One way is to introduce a gas into the tube which is ionised by the scanning electron beam. An ion current then serves to produce a positive charge or pedestal on the rear surface of the pyroelectric material. Another technique is to cause the electrons in the electron beam to accelerate to a high velocity during the line flybacks. In this way secondary electrons are removed from the pyroelectric target, leaving a positive charge. Yet another method is to apply a voltage ramp to the signal plate so as to provide, by capacitative coupling, a positive voltage on the scanned surface. Finally, a theoretical method has been proposed of providing the pedestal or positive bias by manufacturing the pyroelectric material in some way so that it is slightly conductive and applying a positive potential to the signal plate. This last technique has, however, never been commercially successful since, despite a considerable amount of research work, no satisfactory way of rendering the pyroelectric material slightly conductive has hitherto been found.

SUMMARY OF THE INVENTION

This invention arose during tests on a reticulated target when it was found that the video signal produced undesired dark patches when fed to a video display. It was realised that this could be accounted for if the etch-stop applied to the rear surface of the target before the etching process had become slightly conductive and if the etch stop at the front of the pyroelectric material had somehow sputtered onto the sides of the grooves thereby forming a slightly conductive path between the signal plate and the rear scanned surfaces. An object of this invention is to achieve this same effect deliberately thereby providing an effective pedestal in a particularly simple way. This theory was tested and confirmed by making the potential of the signal plate positive. The dark patches became bright patches confirming that the conductive path from the signal plate to the scanned surface was serving to bias that surface positive, thereby providing the pedestal.

Accordingly the invention provides a target for a pyroelectric camera comprising an electrode at the front of the target, a number of pyroelectric members behind the electrode, electrically conductive material on the rear surfaces of the pyroelectric members and electrically conductive paths from the electrode to the conductive material on the said rear surfaces.

The conductive paths are preferably on the sides of the members or islands of pyroelectric material and can be provided by vacuum deposition. The conductive material on the rear surfaces of the islands can be provided in the same vacuum deposition process. A mixture of nickel and chromium is a suitable conductor for this purpose.

The conductive material is preferably applied by evaporating the material onto the target at an acute angle to its surface. This ensures that at least one side of each island becomes coated. It would, of course, be possible to repeat the process at one or more different angles so as to coat all the sides of each island.

The application of the coating to the sides of the islands must be controlled so that it provides a resistance which is sufficiently large to avoid loss of the pyroelectric charge whilst not being so large as to prevent an effective positive pedestal being provided. In this context it should be explained that the resistance of the 'conductive' paths will normally be quite high. Thus, the term 'conductive' is used in this specification to mean "more conductive that the pyroelectric material".

These and other advantages, features and objects of the invention will become apparent from the following description with reference to the accompanying drawings wherein:

DESCRIPTION OF THE PREFERRED EMBODIMENT

Figure 1:
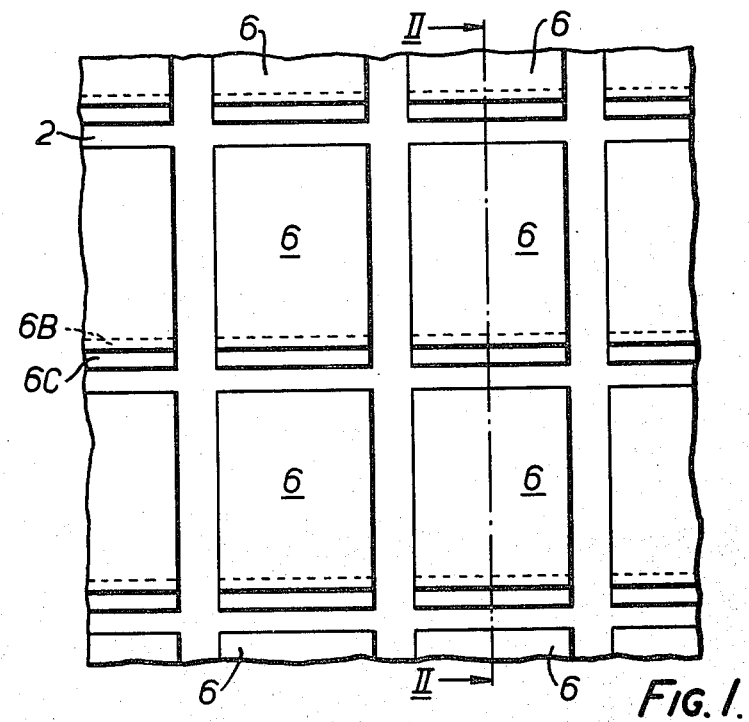
FIG. 1 is a plan view of a reticulated target constructed in accordance with the invention.

Referring to the drawings, the illustrated target is made from a sheet of DTGS, indicated at 1, which is typically about fifteen to twenty microns thick (the dimensions shown in the Figures are not to scale). In alternative forms of the invention, other pyroelectric materials could be used, for example TGS, TGFB, LiTaO$_3$, Pb$_5$Ge$_3$O$_{11}$, PBZT or PVF$_2$.

A layer 2 of electrically conductive etch-stop material, is then evaporated onto one side of a sheet to a thickness of about one thousand Ångströms. On top of this is evaporated a layer 3 about fifty Angstroms thick consisting of a mixture of nickel and chromium. This forms the signal plate.

After formation of the signal plate 3 a suitable setable plastics material is applied in liquid form and the sheet is then spun to distribute the liquid over the signal plate in a uniform layer. This is allowed to set to form a support layer 4 which gives physical support to the target.

An etch stop material is then applied in the form of a pattern on the opposite side to form a layer 5. The underlying layer 1 is then etched away by an etching process to form crossed grooves defined by the pattern of the etch stop.

The etching process is continued until the layer 2 of etch-stop material is reached. This forms a large number of islands the distance between the centres of adjacent islands being about 50 microns for a typical target.

Figure 2:
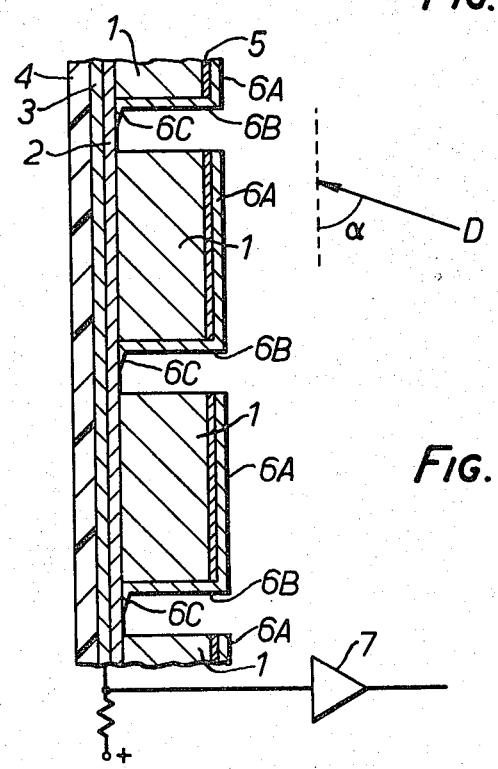
FIG. 2 is a cross-section through the line II—II of FIG. 1, also showing, schematically, and electrical connection from the signal plate.

Conducting material, which may be a mixture of nickel and chromium, is then evaporated onto the rear of the target in the direction indicated by the arrow D on FIG. 2. This is at an acute angle α to the plane of the rear surface of the target; thereby ensuring that a layer 6A of conducting material is deposited over the etch-stop 5, a layer 6B over one side of each island and a layer 6C over a part of the etch-stop 2. The layers 6 are typically about 10 Angstroms thick.

The target is then completed and can be mounted in a camera tube. In use, the rear surface, carrying the layer 6, is scanned by an electron beam whilst the front surface, carried by the layer 4, is exposed to infra-red radiation. The signal plate 3 is biassed by a positive potential, for example of 20 or 30 volts so as to provide the required positive pedestal by conduction through the signal plate 3; the etch-stop 2 which is conductive; and the conductive layers 6C, 6B and 6A to the scanned surfaces of the pyroelectric islands or members formed from the sheet 1.

The signals from the signal plate 3 are connected to the input of an amplifier 7 and are processed in a known manner before being fed to a video display.

Figure 3:
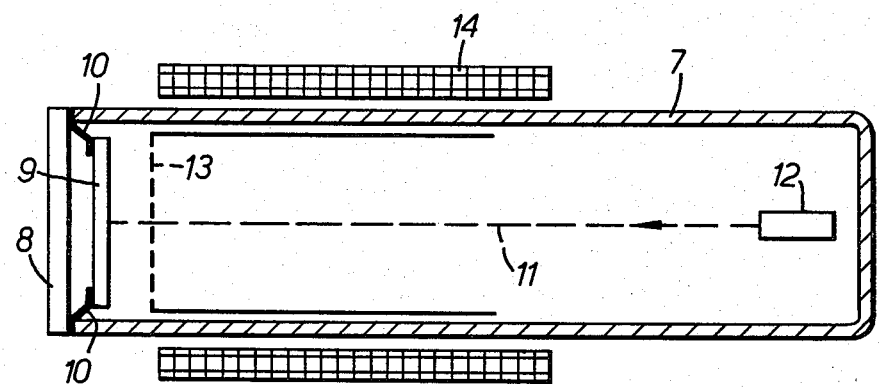
FIG. 3 is a longitudinal section through a camera tube incorporating the target of this invention.

The target, mounted in a camera tube, is illustrated in FIG. 3. The tube 7 has a front window 8 behind which the target 9 is supported by mounts 10. The rear surface of the target is scanned by an electron beam 11 projected from a cathode 12, through an anode 13. The beam is focussed and scanned by coils, indicated at 14.

It will be appreciated that the particular form of the invention which has been described is only an example of one possible way in which the invention can be employed. Many modifications are possible. For example, the reticulations need not be square nor rectangular, the particular materials mentioned could be replaced by different materials, the thicknesses of the various layers could be different and they could be applied using different techniques. It is, however, believed that a target built approximately as described will provide a particularly simple and effective method of maintaining the required pedestal voltage.

I claim:

1. A target for a pyroelectric camera comprising an electrode having a front side and a rear side, a number of pyroelectric members behind the electrode and having rear surface parts, electrically conductive material on said rear surface parts of the pyroelectric members and electrically conductive paths from the electrode to the conductive material on the said rear surface parts, each conductive path being on its associated pyroelectric member, an opposite side of each pyroelectric material being substantially free from conductive material.

2. A target according to claim 1 in which the conductive paths are formed by vacuum deposition of conductive material.

3. A target according to claim 1 including a layer of electrically conductive material between the pyroelectric members and the electrode.

4. A target according to claim 3 in which the said layer of electrically conductive material is an etch stop material for preventing damage to the electrode by ion etching of the pyroelectric material during manufacture of the target.

5. A target according to claim 1 including a support layer in front of the electrode for supporting the target.

6. A target for a pyroelectric camera comprising, in combination:
an electrically conductive signal plate having one side adapted to receive infra-red radiation from a viewed scene and to which plate a positive potential is adapted to be applied to provide a pedestal voltage;
a plurality of discrete islands of pyroelectric material carried by said plate and disposed on that side thereof opposite said one side to present a reticulated pyroelectric surface to be scanned by an electron beam for providing a video signal representative of the infra-red image from the viewed scene; and
means on said islands for providing electrically conductive paths from said signal plate to and over said reticulated pyroelectric surface whereby a positive potential applied to said signal plate provides said pedestal voltage, said means being more conductive than said pyroelectric material but providing a resistance sufficiently large as to avoid loss of pyroelectric charge while allowing said pedestal voltage to be provided.

7. A pyroelectric camera comprising a target in accordance with claim 6 and means for providing an electron beam and means for scanning the rear surface of the target with the electron beam.

8. A camera according to claim 7 including means for applying a positive potential to the signal plate.

9. A target as defined in claim 6 wherein said signal plate includes a layer of electrically conductive etch-stop material which mounts said pyroelectric members and into contact with which said means extends.

10. A target as defined in claim 9 wherein each island presents a rear surface having an electrically conductive coating constituting part of said means, and said means also including a plurality of discrete strips of electrically conductive material, the electrically conductive coating of each island having a discrete strip extending therefrom, along a side of the respective island and into contact with said etch-stop material.

11. A target as defined in claim 10 wherein each said coating includes a layer of electrically conductive etch-stop material on the rear surface of a respective island.

12. A target as defined in claim 12 wherein each coating also includes a layer of electrically conductive material on the layer of etch-stop material.

13. A target as defined in claim 6 wherein said means is formed in part by an electrically conductive metal such as nickel or chromium and in part by another electrically conductive material.

14. A target as defined in claim 12 wherein the electrically conductive material last mentioned is an etch-stop material.

15. A target for a pyroelectric camera comprising an electrode means at the front of the target adapted for connection to positive bias voltage, a number of discrete pyroelectric members behind said electrode means and in contact therewith, each of said members having a rear surface adapted to be scanned by an electron beam, electrically conductive material covering the rear surfaces of the pyroelectric members, and means for providing a positive pedestal voltage on said rear surfaces by establishing a slightly electrically conductive path from the electrode means to the conductive material on each of said rear surfaces, said high resistance being of a value to avoid loss of pyroelectric charge on each of said rear surfaces while ensuring that said pedestal voltage is effective to ensure that a scanning electron beam provides an efficient read-out of the charge distribution on the rear surfaces of the pyroelectric members.

16. A method of making a target in accordance with claim 15 in which the rear surface parts are planar and in which the conductive paths and the conductive material on the rear surface parts of the pyroelectric members are provided by evaporating conductive material onto the target at an acute angle to the rear surface parts.

17. A target as defined in claim 15 wherein said electrode means comprises an electrode and a layer of electrically conductive etch-stop material covering one side of said electrode and on which said pyroelectric members are supported.

18. A target as defined in claim 17 wherein said conductive paths extend from the rear surfaces of respective pyroelectric members, along at least one side of the respective pyroelectric members and into contact with said etch-stop material.

19. A target as defined in claim 18 wherein at least one side of each pyroelectric member is devoid of said means for providing a pedestal voltage.

* * * * *